United States Patent
Mochizuki

(10) Patent No.: US 10,791,015 B2
(45) Date of Patent: Sep. 29, 2020

(54) WIRELESS COMMUNICATION APPARATUS, WIRELESS COMMUNICATION METHOD, AND NON-TRANSITORY COMPUTER READABLE MEDIUM

(71) Applicant: NEC CORPORATION, Tokyo (JP)

(72) Inventor: Takuji Mochizuki, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/439,842

(22) Filed: Jun. 13, 2019

(65) Prior Publication Data
US 2019/0386865 A1 Dec. 19, 2019

(30) Foreign Application Priority Data
Jun. 13, 2018 (JP) .................................. 2018-112821

(51) Int. Cl.
H04L 25/03 (2006.01)
H04L 27/26 (2006.01)
H04L 25/02 (2006.01)
H04B 7/0452 (2017.01)

(52) U.S. Cl.
CPC ........ *H04L 27/2623* (2013.01); *H04B 7/0452* (2013.01); *H04L 25/0202* (2013.01)

(58) Field of Classification Search
CPC ............ H04L 27/2623; H04L 25/0202; H04B 7/0452; H03F 1/0288; H03F 1/3247; H03F 3/24

USPC ................. 375/267, 295, 296, 297
See application file for complete search history.

(56) References Cited

U.S. PATENT DOCUMENTS

| | | | | |
|---|---|---|---|---|
| 5,361,039 A | * | 11/1994 | Michel .................. | H03F 1/3241 327/317 |
| 2015/0200630 A1 | * | 7/2015 | Zhou ...................... | H03F 1/3241 375/295 |
| 2015/0303875 A1 | * | 10/2015 | Borodulin ............. | H03F 1/3247 330/295 |

FOREIGN PATENT DOCUMENTS

JP 2013-115594 A 6/2013

* cited by examiner

*Primary Examiner* — Tesfaldet Bocure
(74) *Attorney, Agent, or Firm* — Sughrue Mion, PLLC

(57) ABSTRACT

A wireless communication apparatus includes amplifiers, peak component suppression units respectively corresponding to the amplifiers and configured to suppress, down to a first threshold, a peak level of a composite signal in which transmission signals to be transmitted to a plurality of terminals are superimposed, a detection unit configured to detect transmission power of the composite signal input to each of the peak component suppression units, and a control unit configured to perform at least one of control of the first threshold of each peak component suppression unit and a saturation point of an amplifier corresponding to each peak component suppression unit and control of the transmission power of the composite signal in accordance with the transmission power detected by the detection unit.

13 Claims, 9 Drawing Sheets

WIRELESS COMMUNICATION APPARATUS, WIRELESS COMMUNICATION METHOD, AND NON-TRANSITORY COMPUTER READABLE MEDIUM

INCORPORATION BY REFERENCE

This application is based upon and claims the benefit of priority from Japanese patent application No. 2018-112821, filed on Jun. 13, 2018, the disclosure of which is incorporated herein in its entirety by reference.

TECHNICAL FIELD

The present disclosure relates to a wireless communication apparatus, a wireless communication method, and a non-transitory computer readable medium.

BACKGROUND ART

MU-MIMO (Multi User-Multi Input Multi Output) or Massive MIMO function, which enables simultaneous transmission from antennas with transceivers having a large number of elements independent of one another to be made to a plurality of wireless terminals is known. In this function, spatially multiplexed signals transmitted toward a plurality of wireless terminals are superposed in layers in a DBB (Digital Baseband) domain by BF (Digital Beamforming) function. Further, an AAS (Active Antenna System) having the MU-MIMO or Massive MIMO function is known.

In a transmission system of the AAS, IFFT (Inverse Fast Fourier Transform) is performed on a frequency domain signal based on subcarrier transmission such as OFDM (Orthogonal Frequency Division Multiplexing) in a transmitting circuit unit in the previous stage of a transmitting AMP (Amplifier). By the IFFT, the frequency domain signal is transformed into a time domain signal. Further, the transmission system of the AAS has a CFR (Crest Factor Reduction) function in order to prevent breakdown and increase in power consumption of an AMP device due to over input occurring when a transmission signal with an amplitude distribution having a high PAPR (Peak-to-Average Power Ratio) passes through the transmission AMP.

The CFR function is adopted in order to prevent excessive spectrum spreading due to hard clipping and full saturation in AMP output when DPD (Digital-Pre-Distortion) non-linear distortion compensation function is provided. In other words, the CFR function prevents the occurrence of spectrum spreading caused by non-linear distortion exceeding the DPD compensation capability. The CFR function is implemented in a transmission digital baseband unit and attenuates a signal peak component gradually from the high peak side. The CFR function is executed using a CFR threshold, which is a threshold for suppressing the maximum peak component (threshold at the maximum peak passage level) so that the peak component of a transmission signal does not reach the saturation level of transmission AMP output. The CFR threshold is generally fixed at an absolute level regardless of a transmission level setting.

When the CFR threshold is fixed, the transmission AMP saturation level does not vary, which causes suppression or loss of a peak component exceeding this threshold, and non-linear distortion occurs in a multilayer signal, which is a composite signal in which transmission signals to be transmitted to a plurality of terminals are superimposed on each other. This causes the occurrence of in-band EVM (DL SINR) (EVM: Error Vector Magnitude, DL: Downlink, SINR: signal to interference plus noise ratio) degradation. This results in throughput degradation in each terminal due to DL SINR degradation of a transmission signal transmitted to each terminal. Further, a multilayer signal subjected to non-linear distortion is emitted to each terminal, which causes a failure to achieve the expected MU-MIMO capability. To be specific, a beam pattern for each terminal is degraded, and Null formation toward another terminal is deviated from an expected value.

There are related techniques for controlling the above-described CFR threshold. Japanese Unexamined Patent Application Publication No. 2013-115594 discloses a power amplifier that controls the CFR threshold. The power amplifier disclosed therein compares the PAPR of a CCDF (Complementary Cumulative Distribution Function) monitor in the CFR unit with the PAPR of the CCDF monitor after feedback from the transmission AMP to the DPD unit. When the comparison result shows that it is operating in the nonlinear amplification region of the AMP, the CFR threshold is reduced to prevent it from reaching hard clipping saturation by the AMP.

In the AAS, when the correlation of all layer signals meets specified conditions, the average level of a multilayer signal, which is a composite signal where transmission signals that pass through each transmission BB unit, RF unit and transmission AMP and are transmitted to a plurality of terminals are superimposed on one another, increases and decreases, which causes a deviation.

When the number of terminals which are spatial multiplexed is large and those terminals are located at random with uniform density, the average level of the composite signal passing through each transmission system (DBB unit, RF unit and transmission AMP) in the AAS tends to be equalized. On the other hand, when the number of terminals which are spatial multiplexed is small, the average level of the composite signal passing through each transmission system is not equal, and a significant difference in level can occur among transmitters. Likewise, even when the number of terminals which are spatial multiplexed is large, a significant difference in level can occur among transmitters if those terminals are not located with uniform density (when the terminals are localized in positions).

In such a case, the average level of the composite signal increases excessively, and in the transmission system to which the composite signal where the peak component exceeds the CFR threshold is input, suppression or lacking occurs in the peak component exceeding the CFR threshold, causing the composite signal to be subjected to non-linear distortion. This results in degradation of a beam pattern for each terminal and degradation of Null formation toward another terminal, which makes it difficult to achieve good MU-MEMO capability.

The above-mentioned Japanese Unexamined Patent Application Publication No. 2013-115594 discloses or suggests nothing about the above-described problems in the AAS. Further, because the technique disclosed therein reduces the CFR threshold so as not to reach the saturation region of the AMP, the peak level (peak component) exceeding the CFR threshold is suppressed. Thus, with use of the technique disclosed in this patent literature, it is expected that the composite signal is subjected to non-linear distortion. Therefore, use of the above-mentioned patent literature can result in a failure to achieve good MU-MIMO capability.

SUMMARY

The present disclosure has been accomplished to solve the above problems and one of objects of the present disclosure is thus to provide a wireless communication apparatus, a wireless communication method, and a wireless communication program capable of achieving good MU-MIMO capability.

A wireless communication apparatus according to a first aspect includes a plurality of amplifiers, a plurality of peak component suppression units respectively corresponding to the amplifiers and configured to suppress, down to a first threshold, a peak level of a composite signal in which transmission signals to be transmitted to a plurality of terminals are superimposed, a detection unit configured to detect transmission power of the composite signal input to each of the peak component suppression units, and a control unit configured to perform at least one of control of the first threshold of each peak component suppression unit and a saturation point of an amplifier corresponding to the peak component suppression unit and control of the transmission power of the composite signal in accordance with the transmission power detected by the detection unit.

A wireless communication method according to a second aspect includes detecting transmission power of a composite signal input to each of a plurality of peak component suppression units, the composite signal containing transmission signals to be transmitted to a plurality of terminals superimposed on each other, and performing at least one of control of a first threshold for suppressing a peak level of the composite signal used in each peak component suppression unit and a saturation point of an amplifier corresponding to the peak component suppression unit and control of transmission power of the composite signal in accordance with the detected transmission power.

A non-transitory computer readable medium storing a wireless communication program according to a third aspect is a non-transitory computer readable medium storing a wireless communication program causing a wireless communication apparatus to perform detecting transmission power of a composite signal input to each of a plurality of peak component suppression units, the composite signal containing transmission signals to be transmitted to a plurality of terminals superimposed on each other, and performing at least one of control of a first threshold for suppressing a peak level of the composite signal used in each peak component suppression unit and a saturation point of an amplifier corresponding to the peak component suppression unit and control of transmission power of the composite signal in accordance with the detected transmission power.

BRIEF DESCRIPTION OF DRAWINGS

The above and other aspects, features and advantages of the present disclosure will become more apparent from the following description of certain exemplary embodiments when taken in conjunction with the accompanying drawings, in which.

EMBODIMENTS

Embodiments of the present disclosure will be described hereinafter with reference to the drawings. Note that the following description and the attached drawings are appropriately shortened and simplified to clarify the explanation. In the figures, the identical reference symbols denote identical structural elements and the redundant explanation thereof is omitted.

First Example Embodiment

Figure 1:
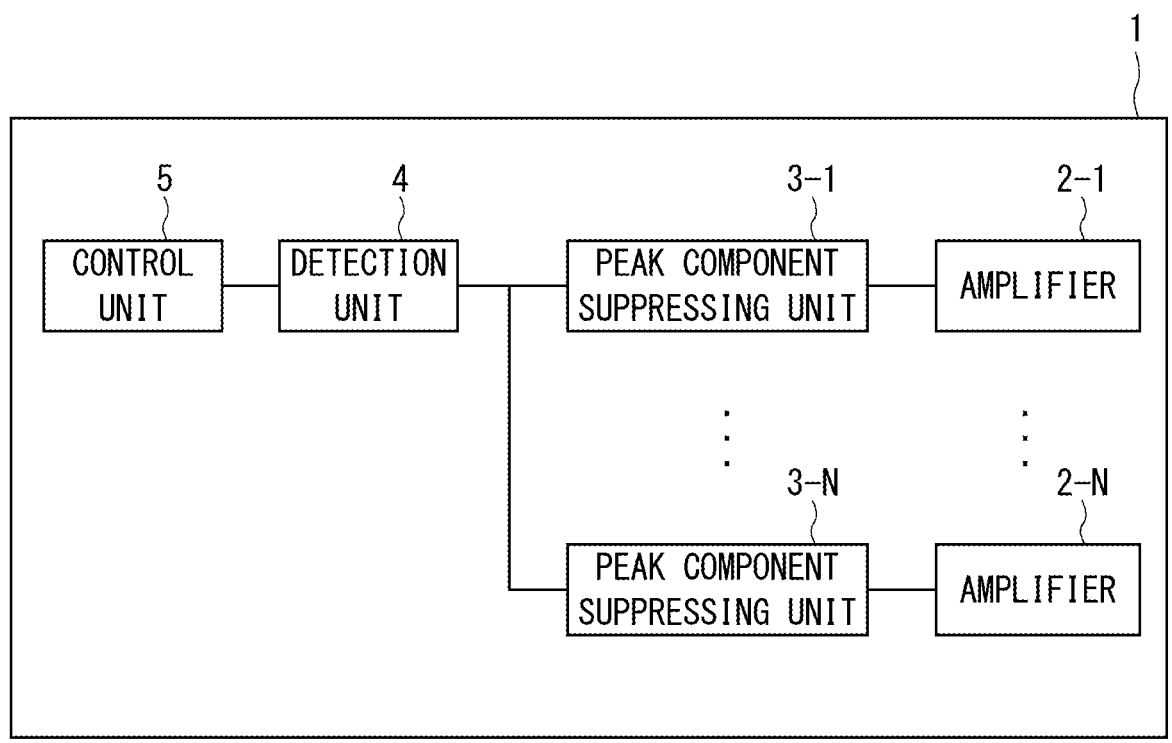
FIG. 1 is a view showing a configuration example of a wireless communication apparatus according to a first example embodiment.

A wireless communication apparatus 1 according to a first example embodiment is described hereinafter with reference to FIG. 1. FIG. 1 is a view showing a configuration example of a wireless communication apparatus according to the first example embodiment.

The wireless communication apparatus 1 may be, for example, an AAS comprising a plurality of antennas and a plurality of transmitters respectively corresponding to the plurality of antennas. The wireless communication apparatus 1 includes amplifiers 2-1 to 2-N (N is a natural number of 2 or more), peak component suppressing units 3-1 to 3-N, a detection unit 4, and a control unit 5.

The amplifiers 2-1 to 2-N amplify an input composite signal in which transmission signals to be transmitted to a plurality of terminals are superimposed on each other, and output the signal.

The peak component suppressing unit 3-1 to 3-N are respectively provided so as to correspond to the amplifiers, and suppress, down to a first threshold, the peak level of the composite signal in which transmission signals to be transmitted to a plurality of terminals are superimposed on each other.

The detection unit 4 detects the transmission power of the composite signal input to each of the peak component suppressing unit 3-1 to 3-N. The transmission power detected by the detection unit 4 may be the average value at every specified time of the transmission power of the composite signal input to each of the peak component suppressing unit 3-1 to 3-N. Alternatively, the transmission power detected by the detection unit 4 may be the peak power of the composite signal input to each of the peak component suppressing unit 3-1 to 3-N. Alternatively, the transmission power detected by the detection unit 4 may include both the average value at every specified time of the transmission power and the peak power of the composite signal input to each of the peak component suppressing unit 3-1 to 3-N.

The control unit 5 performs at least one of control of a first threshold of each of the peak component suppressing unit 3-1 to 3-N and a saturation point of each of the amplifiers 2-1 to 2-N, and control of the transmission power of the composite signal in accordance with the transmission power detected by the detection unit 4.

As described above, the detection unit 4 detects the transmission power of the composite signal input to each of the peak component suppressing unit 3-1 to 3-N. The control unit 5 performs at least one of control of a first threshold of each of the peak component suppressing unit 3-1 to 3-N and a saturation point of each of the amplifiers 2-1 to 2-N, and control of the signal level of the composite signal in accordance with the transmission power detected by the detection unit 4. Specifically, the control unit 5 reduces suppression of the peak level of the composite signal input to each of the peak component suppressing unit 3-1 to 3-N by the first threshold. Further, the control unit 5 reduces non-linear distortion that occurs when the composite signal output from each of the amplifiers 2-1 to 2-N exceeds the saturation point of the amplifier. Therefore, the first example embodiment enables good MU-MIMO capability to be achieved.

Second Example Embodiment

A second example embodiment is described next. The second example embodiment is an example embodiment in which the first example embodiment is described in more detail.

<Average Level of Multilayer Signal Passing Through Each Transmitter>

Figure 2:
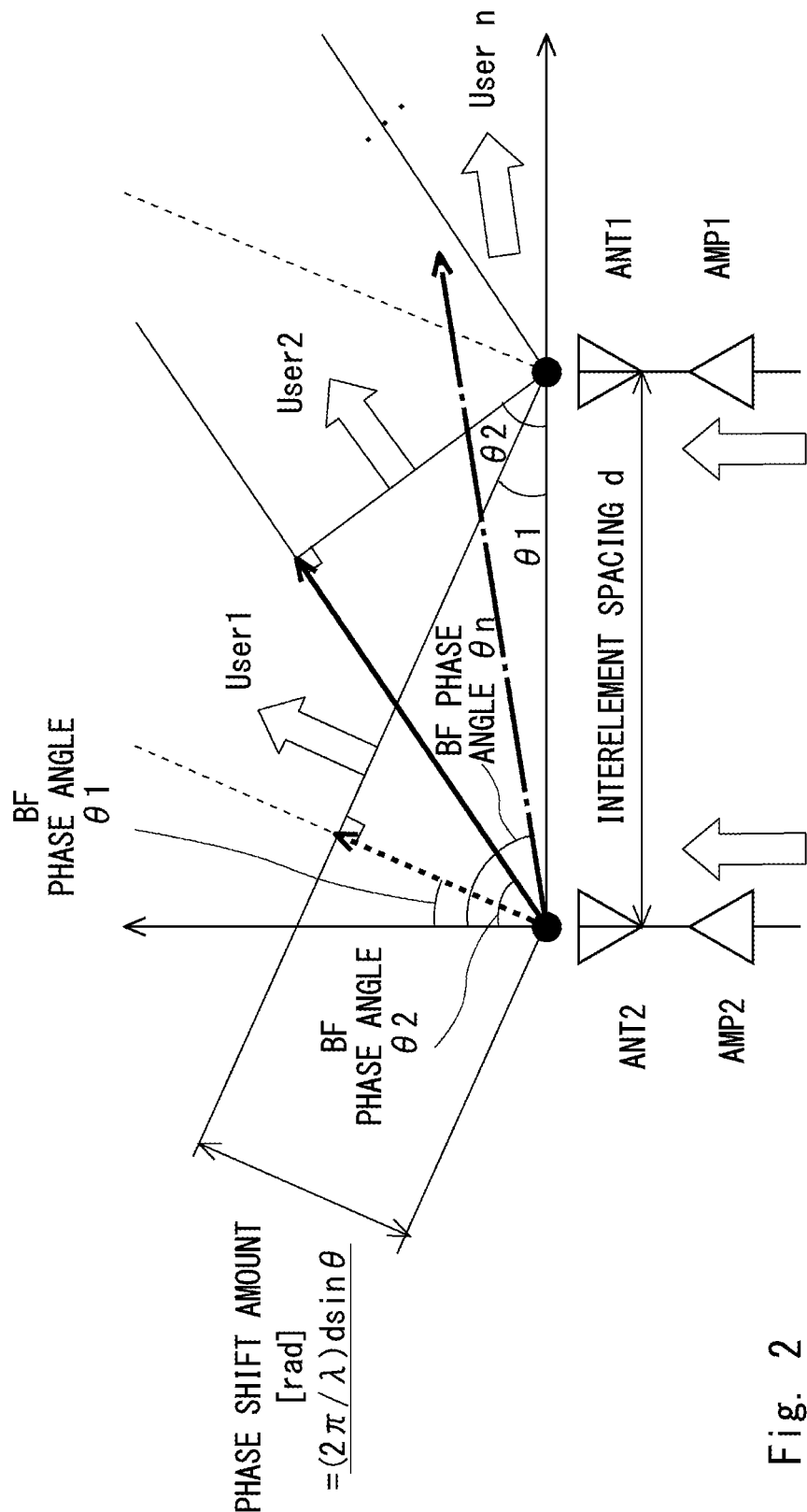
FIG. 2 is a view illustrating transmission power of a multilayer signal passing through each transmitter.
Figure 3:
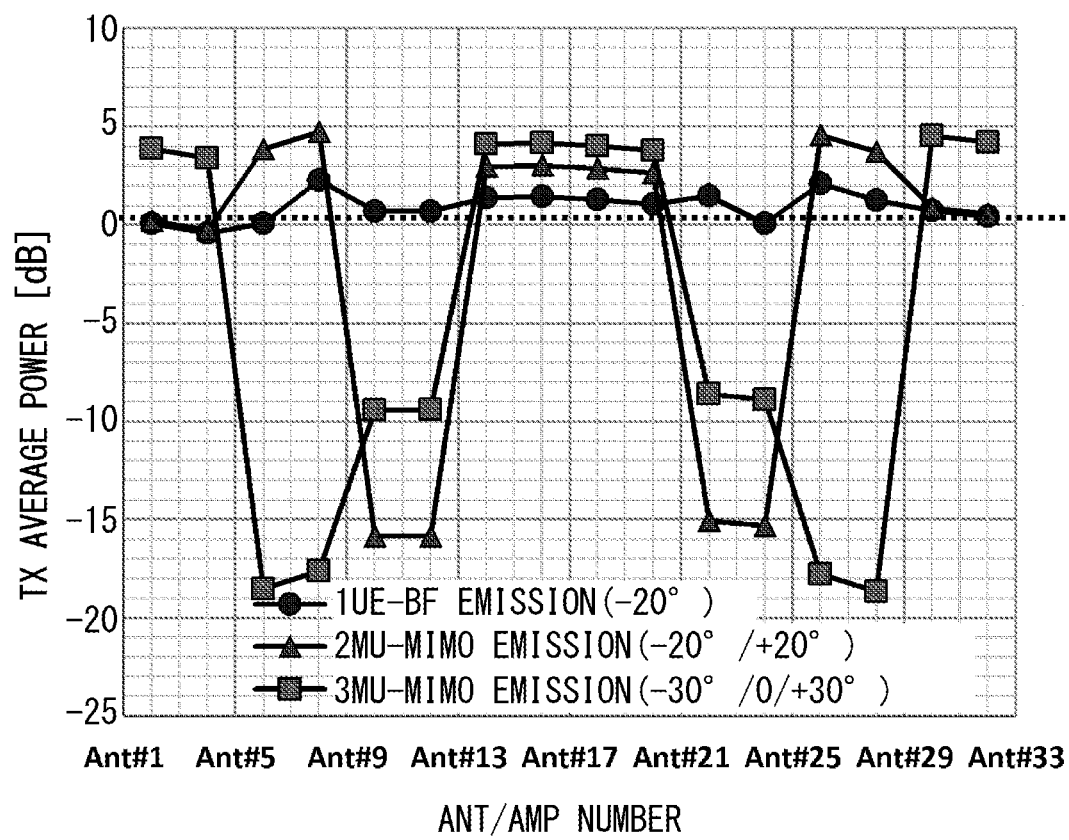
FIG. 3 is a view illustrating transmission power of a multilayer signal passing through each transmitter.

Prior to describing the details of the second example embodiment, the transmission power of a multilayer signal passing through each transmitter in the AAS is described. The multilayer signal corresponds to the composite signal in the first example embodiment. FIGS. 2 and 3 are views illustrating the transmission power of the multilayer signal passing through each transmitter. As described above, when the number of terminals which are spatial multiplexed is small or when the terminals are not located equally (when the terminals are localized in positions), a difference arises in the total level (transmission power) of the multilayer signal passing through each transmitter, which can cause a significant difference in level among transmitters.

For example, it is assumed that the total output (total transmission power) of a plurality of transmitters (TX) is X [dBm], and transmission signals of n (n is a natural number of 2 or more) number of layers are multiplexed together. In this case, the output level (transmission power) of the transmission signal of each layer is X-10 Log(n) [dBm] in total of all the transmitters TX. All the transmitters TX transmit and emit the multilayer signal with this output level. Assuming the case of one layer for one user, n number of layers corresponds to the total number of signals for n number of users (n number of terminals), which is calculated by n users×1 layer/user. Further, the output level of the transmission signal of each layer is obtained by equally dividing the total output of the n number of layers by the number of users. The amplitude level of the transmission signal passing through each transmitter TX, which is required to form each layer emission, can significantly vary among transmitters as described above.

FIG. 2 is a view showing the way the transmission signal to each user is emitted. FIG. 2 shows antennas (ANT) 1 and 2 that are adjacent to each other in an antenna array having I (I is a natural number of 3 or more) number of antenna elements with the antenna inter-element spacing d. Further, FIG. 2 shows the way an n-layer signal for n users is emitted from the ANT 1 and the ANT 2, where the solid line indicates the transmission signal for a user 1, the dotted line indicates the transmission signal for a user 2, and the alternate long and short dash line indicates the transmission signal for a user n.

A mathematical expression of the transmission signal (passing signal) to each user (each terminal) which passes through each transmission system (ANT and amplifier (AMP)) is as follows.

The passing signal through the ANT 1 and the AMP 1 for each user is as follows.

The passing signal through the ANT 1 and the AMP 1 for the user 1

$$Ae^{j(\omega 1 t + 0 + Pa(t))} \sim Ae^{j(\omega m t + 0 + Pm(t))}$$

The passing signal through the ANT 1 and the AMP 1 for the user 2

$$Be^{j(\omega 1 t + 0 + Pc(t))} \sim Be^{j(\omega m t + 0 + Pm'(t))}$$

The passing signal through the ANT 1 and the AMP 1 for the user n $$ne^{j(\omega 1 t + 0 + Pc(t))} \sim ne^{j(\omega m t + 0 + Pm''(t))}$$

The passing signal through the ANT 2 and the AMP 2 for each user is as follows.

The passing signal through the ANT 2 and the AMP 2 for the user 1

$$Ae^{j(\omega 1 t + \theta 1 + Pa(t))} \sim Ae^{j(\omega m t + \theta 1 + Pm(t))}$$

The passing signal through the ANT 2 and the AMP 2 for the user 2

$$Be^{j(\omega 1 t + \theta 2 + Pc(t))} \sim Be^{j(\omega m t + \theta 2 + Pm'(t))}$$

The passing signal through the ANT 2 and the AMP 2 for the user n $$ne^{j(\omega 1 t + \theta n + Pc(t))} \sim ne^{j(\omega m t + \theta n + Pm''(t))}$$

In the above-described mathematical expressions of the passing signals for the respective users in each transmission system described above, $\omega 1$ to $\omega m$ contained in the complex term indicate OFDM Tone (Sub Carrier) angular frequency. Px(t) contained in the complex term indicates a QAM (Quadrature Amplitude Modulation) modulation signal for each OFDM Tone (Sub Carrier). Each of $\theta 1$ to $\theta n$ indicate the BF (Beam Forming) phase angle of the layer signal emitted from ANT 2 of the users 1 to n. Regarding the passing signals of the users 1 to n, a signal delay corresponding to a phase shift amount [rad] of ($2\pi$/wavelength $\lambda$)·d·sin $\theta$ is added to the passing signal through ANT2/AMP2 with respect to the passing signal through ANT1/AMP1. Thus, the layer signal to each user spatially emitted from the ANTs is emitted in different directions and by different wavefronts.

The above-described phase shift amount is called a beam forming weight to each user (each terminal). When the AAS is used in TDD (Time Division Duplexing) system, this beam forming weight is determined based on UL channel estimation results by UL Channel Sounding from each terminal to the AAS by using the relativity of UL/DL channels.

To be specific, a baseband unit that generates the multilayer signal performs MU-MIMO processing by ZF (Zero Forcing) or the like and determines the beam forming weight so that spatially orthogonal beam patterns for terminals are emitted from the antennas. The baseband unit emits the transmission signal to each terminal based on the determined beam forming weight.

FIG. 3 is a view illustrating an example in which a significant difference in level arises between transmitters TX. The horizontal axis of the graph in FIG. 3 indicates the number of each transmission system (each AMP and each ANT) in the AAS with 32 antennas. Note that the antenna number and the transmission system number correspond to each other. The vertical axis of the graph in FIG. 3 indicates the average power in each transmission system when a reference level is 0 dB. The average power is the average value at every specified time of the transmission power of the passing signal that passes through each transmission system. The reference level is the average value of the transmission power in each transmission system when the AAS outputs the signal at maximum voltage rating.

In FIG. 3, the solid line plotted with circles indicates the average power in each transmission system when beam forming emission is done for 1 user (1 terminal). The direction of the user in this case is −20°. The solid line plotted with triangles in FIG. 3 indicates the average power in each transmission system when beam forming emission is done for 2 users (2 terminals). The directions of the users in this case are −20° and 20°. The solid line plotted with squares in FIG. 3 indicates the average power in each transmission system when beam forming emission is done for 3 users (3 terminals). The directions of the users in this case are −30°, 0° and 30°.

As described above, when the number of terminals which are spatial multiplexed is small or when the number of terminals which are spatial multiplexed is large and those terminals are not located equally, a difference arises in the total level of the multilayer signal passing through each transmitter TX, which can cause a significant difference in level among transmitters. As shown in FIG. 3, in the case of beam forming emission for 1 user, the average power of the 1-layer signal in each of 32 transmission systems is equal. On the other hand, in the case of beam forming emission for 2 or 3 users, the average power of the 1-layer signal exceeds the reference level, which is 0 dB in this example, by about +5 dB in some ANTs such as the ANT 14 to ANT 20, for example. In the ANTs where the average power exceeds the reference level, the passing signal exceeds the CFR threshold, which causes non-linear distortion to occur in the passing signal that passes through those ANTs. In this case, because non-linear distortion is occurring in the passing signal that passes through the ANTs, MU-MIMO spatial multiplexing capability and Null capability are degraded. In view of this, an object of this example embodiment is to reduce the occurrence of non-linear distortion in the passing signal that passes through the ANTs and improve MU-MIMO spatial multiplexing capability and Null capability.

It should be noted that, in the solid line when carrying out beam forming emission for 3 users in FIG. 3, for example, the average power of the passing signal that passes through the ANT 6 to the ANT 12 is lower than the reference level by −10 dB or more. In consideration of both of the ANT where the average power increases and the ANT where the average power decreases, it is necessary to significantly enlarge the dynamic range of the passing signal through the transmitter TX.

<Configuration Example of Wireless Communication Apparatus>

Figure 4:
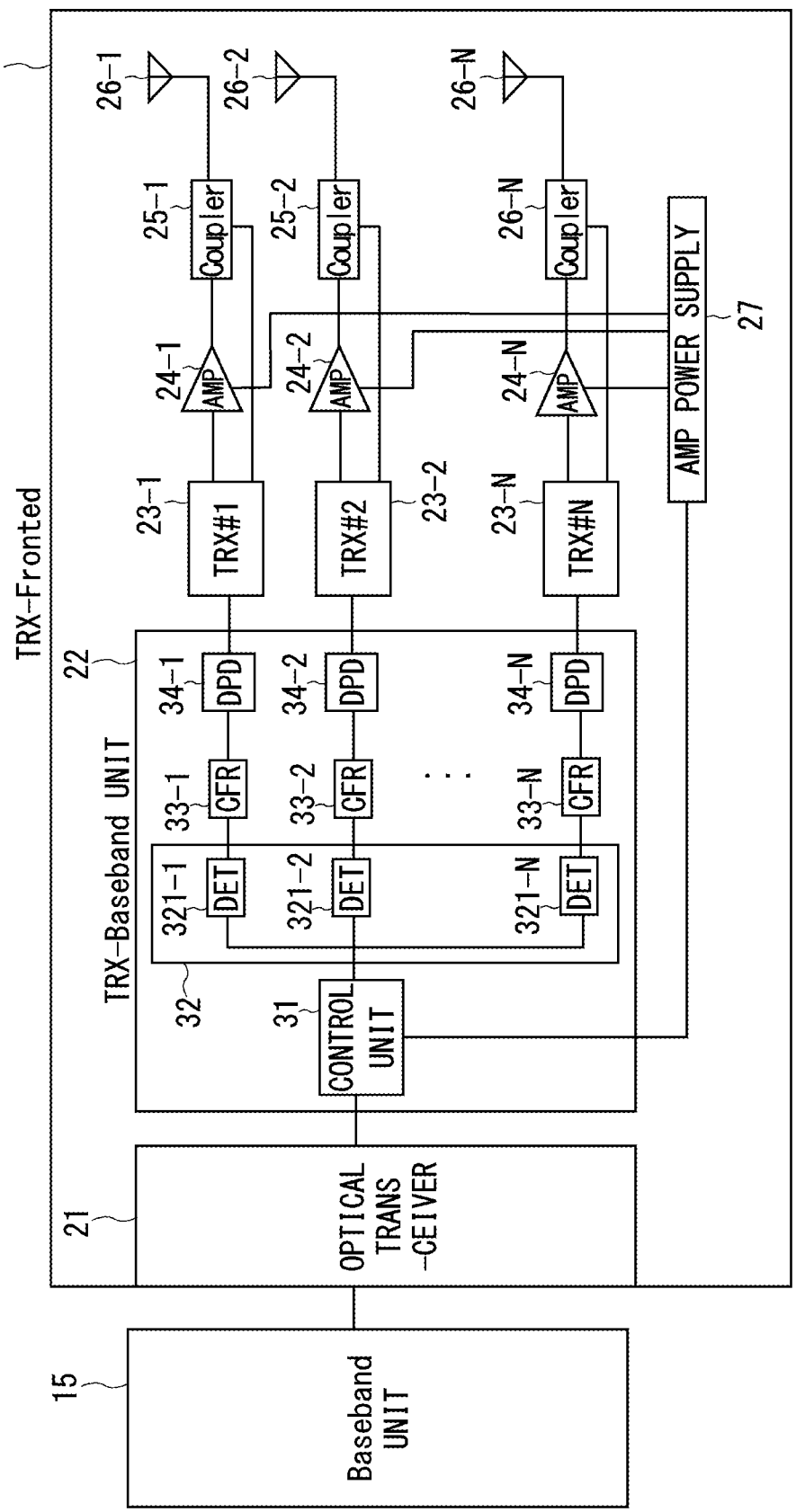
FIG. 4 is a view showing a configuration example of a wireless communication apparatus according to a second example embodiment.

A configuration example of a wireless communication apparatus 10 according to a second example embodiment is described hereinafter with reference to FIG. 4. FIG. 4 is a view showing a configuration example of a wireless communication apparatus according to the second example embodiment. The wireless communication apparatus 10 may be an AAS comprising a plurality of antennas and a plurality of transmitters respectively corresponding to the plurality of antennas, for example. Note that, although FIG. 4 shows only functional blocks related to the present disclosure, the configuration is not limited thereto, and the wireless communication apparatus 10 may include a receiving function or include a transceiver for calibration.

The wireless communication apparatus 10 includes a baseband unit 15 and a transceiver frontend (TRX-frontend) unit 20. The wireless communication apparatus 10 is equivalent of the wireless communication apparatus 1 according to the first example embodiment.

The baseband unit 15 is a baseband unit having the function of generating the multilayer signal. The baseband unit 15 generates the composite signal (multilayer signal) on which transmission signals to be transmitted to n users (n terminals) are superimposed, and transmits this composite signal to the TRX-frontend unit 20. When generating the multilayer signal, the baseband unit 15 adds a signal delay corresponding to a phase shift amount to the layer signal for each user based on the base forming weight.

The TRX-frontend unit 20 includes an optical transceiver 21, a transceiver and receiver baseband (TRX-baseband) unit 22, transceivers and receivers (TRXs) 23-1 to 23-N, and amplifiers (AMPs) 24-1 to 24-N. The TRX-frontend unit 20 further includes directional couplers 25-1 to 25-N, antennas (ANTs) 26-1 to 26-N, and an amplifier (AMP) power source 27.

The TRX-baseband unit 22 includes a control unit 31, a detection unit 32, CFR (Crest Factor Reduction) processing units 33-1 to 33-N, and DPD (Digital Predistortion) processing units 34-1 to 34-N.

Note that, in the following description, when there is no need to distinguish among the TRXs 23-1 to 23-N, the AMPs 24-1 to 24-N and the directional couplers 25-1 to 25-N, they are referred to as the TRX 23, the AMP 24 and the directional couplers 25, respectively. Likewise, when there is no need to distinguish among the ANTs 26-1 to 26-N, the CFR processing units 33-1 to 33-N and the DPD processing units 34-1 to 34-N, they are referred to as the ANT 26, the CFR processing units 33 and the DPD processing units 34, respectively.

The optical transceiver 21 performs photoelectric conversion and its inverse conversion of the multilayer signal transmitted and received between the baseband unit 15 and the TRX-baseband unit 22.

The TRX-baseband unit 22 is a main signal transmitting and receiving digital baseband unit. The TRX-baseband unit 22 performs CFR processing and DPD processing on the multilayer signal received through the optical transceiver 21 and outputs the result to each TRX 23. Further, the TRX-baseband unit 22 detects the transmission power of the multilayer signal output from the baseband unit 15 and input to each of the CFR processing units 33.

To be specific, the TRX-baseband unit 22 detects the average value at every specified time of the transmission power of the multilayer signal input to each of the CFR processing units 33. The TRX-baseband unit 22 controls the CFR threshold to be used by the CFR processing unit 33 and the saturation point of the AMP 24 according to the detected transmission power.

Note that the TRX-baseband unit 22 is described in detail later.

The TRX 23 is a transceiver provided corresponding to the ANT 26 and the AMP 24. Specifically, each of the TRXs 23-1 to 23-N is a transceiver provided in each transmission system, and it is provided corresponding to each of the ANTs 26-1 to 26-N and the AMPs 24-1 to 24-N. The TRX 23 includes a transmitter TX and a receiver RX. The TRX 23 receives, by the transmitter TX, the multilayer signal (IQ signal) output from the DPD processing unit 34 of the TRX-baseband unit 22, converts the received multilayer signal into an RF signal and outputs the RF signal to the AMP 24. Further, the TRX 23 receives the RF signal converted from the output multilayer signal from the directional coupler 25, converts the received RF signal into the multilayer signal (IQ signal), and outputs the multilayer signal to the DPD processing unit 34 of the TRX-baseband unit 22.

The AMPS 24 are equivalent of the amplifiers 2-1 to 2-N according to the first example embodiment. The AMP 24 is an amplifier provided corresponding to the ANT 26. Each AMP 24 is provided between each ANT 26 and the TRX 23 provided corresponding to each ANT 26. The AMP 24 amplifies the multilayer signal output from the TRX 23 and outputs it to the directional coupler 25.

When the output of the AMP 24 is driven up to the saturation point of this AMP 24, non-linear distortion occurs in the multilayer signal output from the AMP 24. The saturation point may be referred to as an AMP hard clipping saturation point. In other words, when the output of the AMP 24 exceeds the saturation point of this AMP 24, the AMP 24 causes non-linear distortion to occur in the amplitude exceeding the saturation point in the multilayer signal output from the AMP 24.

On the other hand, when the output of the AMP 24 is not driven up to the saturation point of this AMP 24, the multilayer signal output from the AMP 24 is amplified and output with linearity maintained. In other words, the AMP 24 does not cause non-linear distortion to occur in the amplitude exceeding the saturation point in the multilayer signal output from the AMP 24 unless the output of the AMP 24 exceeds the saturation point of this AMP 24.

Further, the AMP 24 is controlled to raise or lower the saturation point of the AMP 24 in accordance with a voltage applied from the AMP power supply 27. In other words, the AMP 24 is configured to be able to change a voltage power supply operating point in accordance with a voltage applied from the AMP power supply 27. Thus, the voltage power supply operating point is variable in accordance with a voltage applied from the AMP power supply 27. When a voltage applied from the AMP power supply 27 becomes high, the AMP 24 performs control to raise the saturation point of the AMP 24. When, on the other hand, a voltage applied from the AMP power supply 27 becomes low, the AMP 24 performs control to lower the saturation point of the AMP 24.

The directional coupler 25 is equivalent of each AMT 25 and each AMP 24, and it is a coupler provided between each AMT 25 and each AMP 24. The directional coupler 25 outputs the RF signal of the multilayer signal output from each AMP 24 to each ANT 25 and also to the corresponding TRX 23.

The ANT 26 is an antenna provided corresponding to each TRX 23 and each AMP 24. The ANT 26 transmits the multilayer signal to a plurality of users (a plurality of terminals).

The AMP power supply 27 is a power supply that supplies power to all AMPs 24. The AMP power supply 27 controls the voltage to be applied to each AMP 24 in accordance with control of the detection unit 32.

Configuration examples of the TRX-baseband unit 22 are described hereinafter.

The CFR processing units 33 are equivalent of the peak component suppressing units 3-1 to 3-N in the first example embodiment. The CFR processing unit 33 is provided corresponding to each AMP 24. The CFR processing unit 33 suppresses, down to the CFR threshold, the peak level of the multiplayer signal output from the baseband unit 15 and input through the optical transceiver 21, the control unit 31 and the detection unit 32, and outputs it to the DPD processing unit 34. The CFR threshold is a threshold for suppressing the maximum peak component, and it is a threshold at the maximum peak passing level. To be specific, when the amplitude of the input multilayer signal exceeds the CFR threshold, the CFR processing unit 33 suppresses the amplitude of the multilayer signal down to the CFR threshold and outputs it to the DPD processing unit 34.

The DPD processing unit 34 is provided between each CFR processing unit 33 and each AMP 24. The DPD processing unit 34 compensates for non-linear input-output characteristics in the AMP 24 by using the multilayer signal (IQ signal) output from the CFR processing unit 33 and the multilayer signal (IQ signal) output from the TRX 23 and received through the directional coupler 25 and the TRX 23. The DPD processing unit 34 corrects the amplitude and phase of the multilayer signal (IQ signal) output from the CFR processing unit 33 based on a distortion correction value representing characteristics opposite to the input-output characteristics of the AMP 24 in the subsequent stage.

The detection unit 32 is equivalent of the detection unit 4 in the first example embodiment. The detection unit 32 detects the transmission power of the multilayer signal input to each CFR processing unit 33, and transmits the detected transmission power information of the multilayer signal to the control unit 31. The detection unit 32 detects the average value at every specified time of the transmission power of the multilayer signal. Further, the detection unit 32 outputs the multilayer signal output from the baseband unit 15 and received through the optical transceiver 21 and the control unit 31 to each CFR processing unit 33.

The detection unit 32 includes detection circuits (DETs) 321-1 to 321-N provided corresponding to the CFR processing units 33. Each of the detection circuits 321-1 to 321-N detects the transmission power of the multilayer signal input to each CFR processing unit 33. Each of the detection circuits 321-1 to 321-N transmits the detected transmission power information of the multilayer signal to the control unit 31.

The control unit 31 is equivalent of the control unit 5 in the first example embodiment. The control unit 31 receives the transmission power information of the multilayer signal input from the detection unit 32 to each CFR processing units 33. The control unit 31 controls a combination of the CFR threshold of each CFR processing unit 33 and the saturation point of each AMP 24 in accordance with the transmission power detected by the detection unit 32. Further, the control unit 31 outputs the multilayer signal output from the baseband unit 15 and received through the optical transceiver 21 to the detection circuits 321-1 to 321-N.

Figure 5:
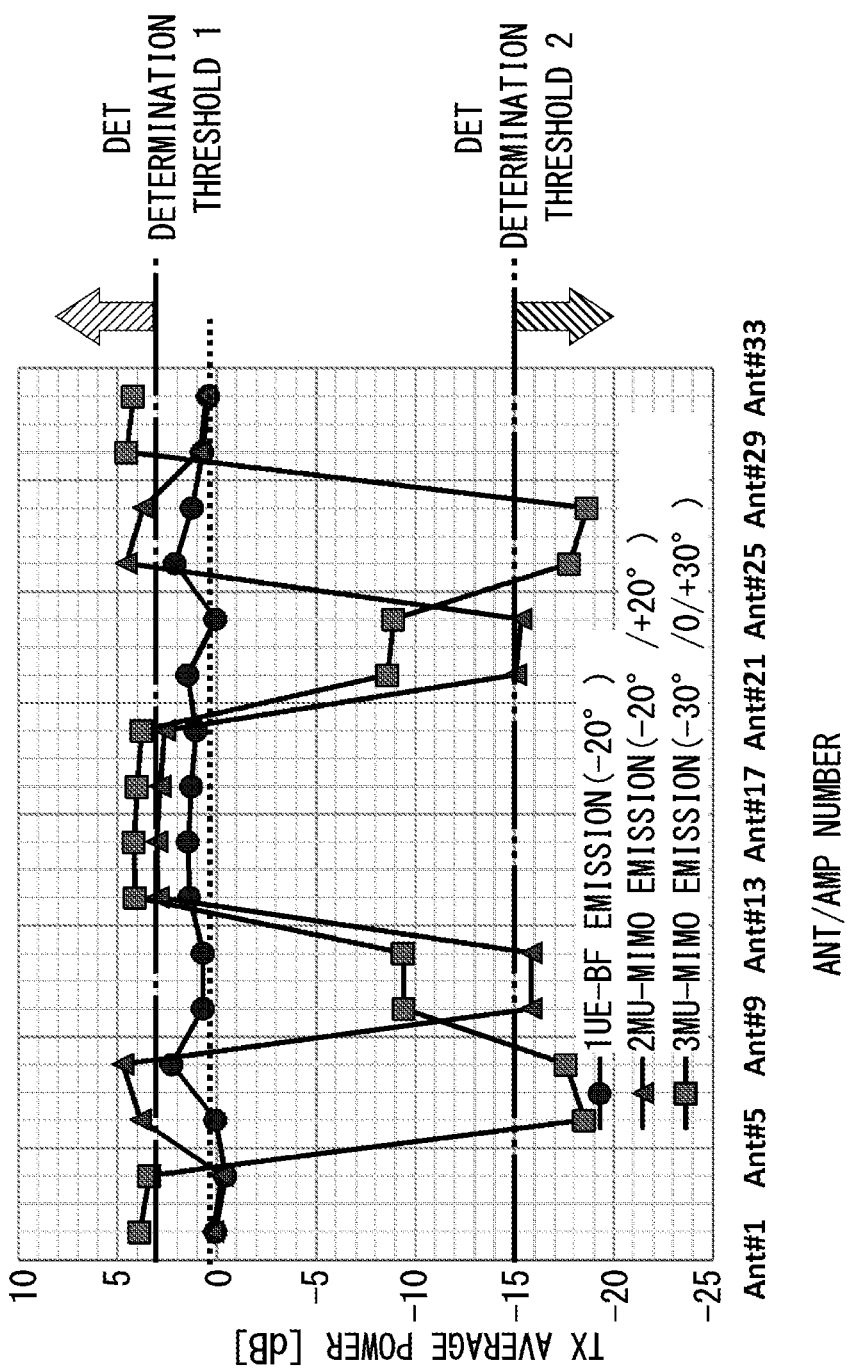
FIG. 5 is a view illustrating control performed by a control unit.

The details of control performed by the control unit 31 are described hereinafter with reference to FIG. 5. FIG. 5 is a view illustrating control performed by the control unit. FIG. 5 is equivalent of FIG. 3, and the detailed description thereof is omitted. In FIG. 5, the alternate long and short dash line indicating a DET determination threshold 1 and the alternate long and three short dashes line indicating a DET determination threshold 2 are added to FIG. 3.

First, the control unit 31 receives the transmission power information of the multilayer signal input to the CFR processing unit 33 from the detection unit 32. It is assumed that the transmission power of the multilayer signal received from the detection unit 32 is as shown in FIG. 5. Note that Ant #1 in FIG. 5 corresponds to the CFR processing unit 33-1, Ant #2 corresponds to the CFR processing unit 33-2, and the same for the others.

Next, the control unit 31 determines whether the transmission power detected by the detection unit 32 is higher than the DET determination threshold 1 or not. When the multilayer signal where the transmission power detected by the detection unit 32 is higher than the DET determination threshold 1 exists, the control unit 31 increases the CFR threshold of the CFR processing unit 33 to which this multilayer signal is input. The control unit 31 increases the CFR threshold of the CFR processing unit 33 to which the multilayer signal with the transmission power detected by the detection unit 32 higher than the DET determination threshold 1 is input by a value corresponding to a difference between the transmission power of the multilayer signal input to the CFR processing unit 33 and the reference level. The reference level is the average value of the transmission power in each transmission system when the wireless communication apparatus 10 outputs the signal at maximum voltage rating.

Further, the control unit 31 raises the saturation point of the AMP 24 corresponding to the CFR processing unit 33 where the CFR threshold is to be changed. The control unit 31 requests the AMP power supply 27 to increase the voltage applied to the AMP 24 where the saturation point is to be raised, and raises the saturation point of the AMP 24 by increasing the voltage applied to the AMP 24. The control unit 31 raises the saturation point of the AMP 24 by a value corresponding to a difference between the transmission power of the multilayer signal input to the CFR processing unit 33 and the reference level. In this manner, the control unit 31 performs control to raise the saturation point of the AMP 24 by the same level as the CFR threshold.

For example, it is assumed that the transmission power of the multilayer signal input to the CFR processing unit 33-1 exceeds the DET determination threshold 1, and a difference between the transmission power of the multilayer signal and the reference level is 5 dB. In this case, the control unit 31 performs control to increase the CFR threshold of the CFR processing unit 33-1 by 5 dB and also raise the saturation point of the AMP 24-1 by 5 dB.

Further, the control unit 31 determines whether the transmission power detected by the detection unit 32 is lower than the DET determination threshold 2 or not. When the multilayer signal where the transmission power detected by the detection unit 32 is lower than the DET determination threshold 2 exists, the control unit 31 decreases the CFR threshold of the CFR processing unit 33 to which this multilayer signal is input. The control unit 31 may perform control to set the CFR threshold back to the initial value when the CFR threshold is higher than the initial value of the CFR threshold immediately after the startup of the wireless communication apparatus 10.

Further, the control unit 31 lowers the saturation point of the AMP 24 corresponding to the CFR processing unit 33 where the CFR threshold is to be changed. The control unit 31 requests the AMP power supply 27 to decrease the voltage applied to the AMP 24 where the saturation point is to be lowered, and lowers the saturation point of the AMP 24 by decreasing the voltage applied to the AMP 24. The control unit 31 may perform control to set the saturation point of the AMP 24 back to the initial value when the saturation point of the AMP 24 is higher than the initial value of the saturation point of the AMP 24 immediately after the startup of the wireless communication apparatus 10.

Figure 6:
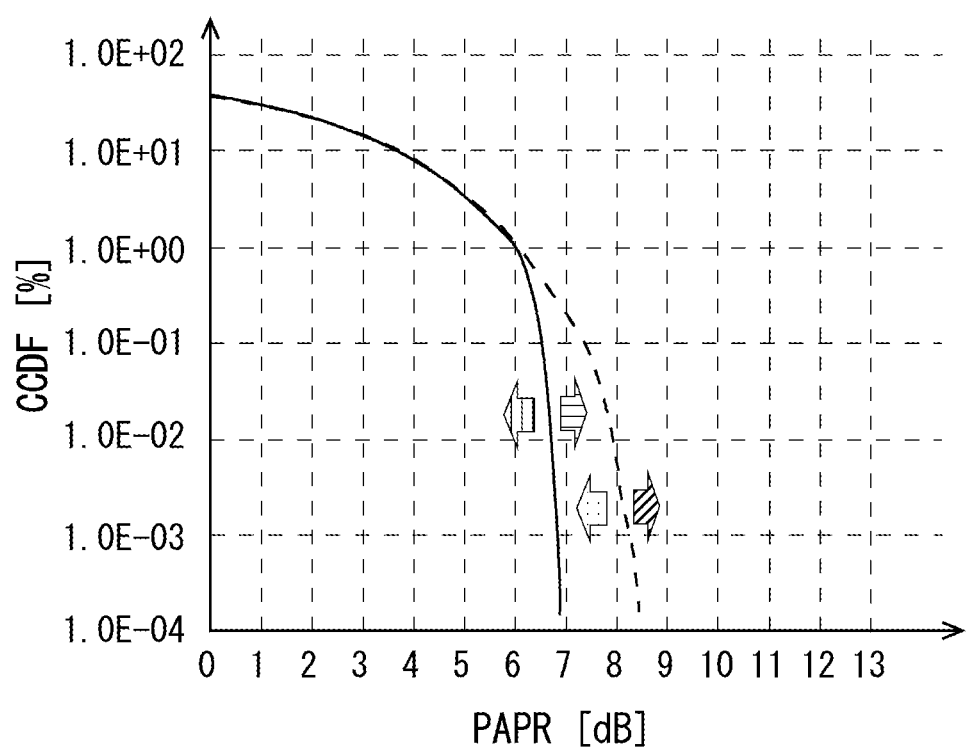
FIG. 6 is a view illustrating control performed by a control unit.

The details of control performed by the control unit 31 are described from another perspective with reference to FIG. 6. FIG. 6 is a view illustrating control performed by the control unit. FIG. 6 shows the characteristics of PAPR of the multilayer signal in each transmission system (TRX 23 and AMP 24). The horizontal axis indicates PAPR (dB), and the vertical axis indicates CCDF (Complementary Cumulative Distribution Function). The solid line indicates CCDF of PAPR when exceeding the CFR threshold. Further, the dotted line indicates CCDF of PAPR when hard clipping of the AMP is performed. The hard clipping is the state where non-linear distortion occurs in the multilayer signal when exceeding the AMP saturation point. As shown in FIG. 6, the characteristics of PAPR when hard clipping of the AMP is done are higher than the characteristics of PAPR when exceeding the CFR threshold.

When the transmission power of the multilayer signal is higher than the DET determination threshold 1, the control unit 31 increases the CFR threshold to be higher than the current threshold so that the peak level of the multilayer signal does not exceed the CFR threshold. Specifically, the control unit 31 sets the CFR threshold to be higher than the current threshold, performs control to shift the solid line in FIG. 6 in the direction of the arrow hatched with horizontal lines to become the dotted line not exceeding the CFR threshold.

When the transmission power of the multilayer signal is lower than the DET determination threshold 2, the control unit 31 decreases the CFR threshold to be lower than the current threshold. Specifically, the control unit 31 sets the CFR threshold to be lower than the current threshold, performs control to shift the solid line in FIG. 6 in the direction of the arrow hatched with vertical lines, thereby reducing PAPR and power consumption.

Further, when the transmission power of the multilayer signal is higher than the DET determination threshold 1, the control unit 31 raises the saturation point of the AMP, performs control to shift the dotted line in FIG. 6 in the direction of the arrow hatched with diagonal lines, thereby avoiding hard clipping.

When the transmission power of the multilayer signal is lower than the DET determination threshold 2, the control unit 31 lowers the saturation point of the AMP, performs control to shift the dotted line in FIG. 6 in the direction of the arrow hatched with dots, thereby reducing PAPR and power consumption.

<Operation Example of Wireless Communication Apparatus>

Figure 7:
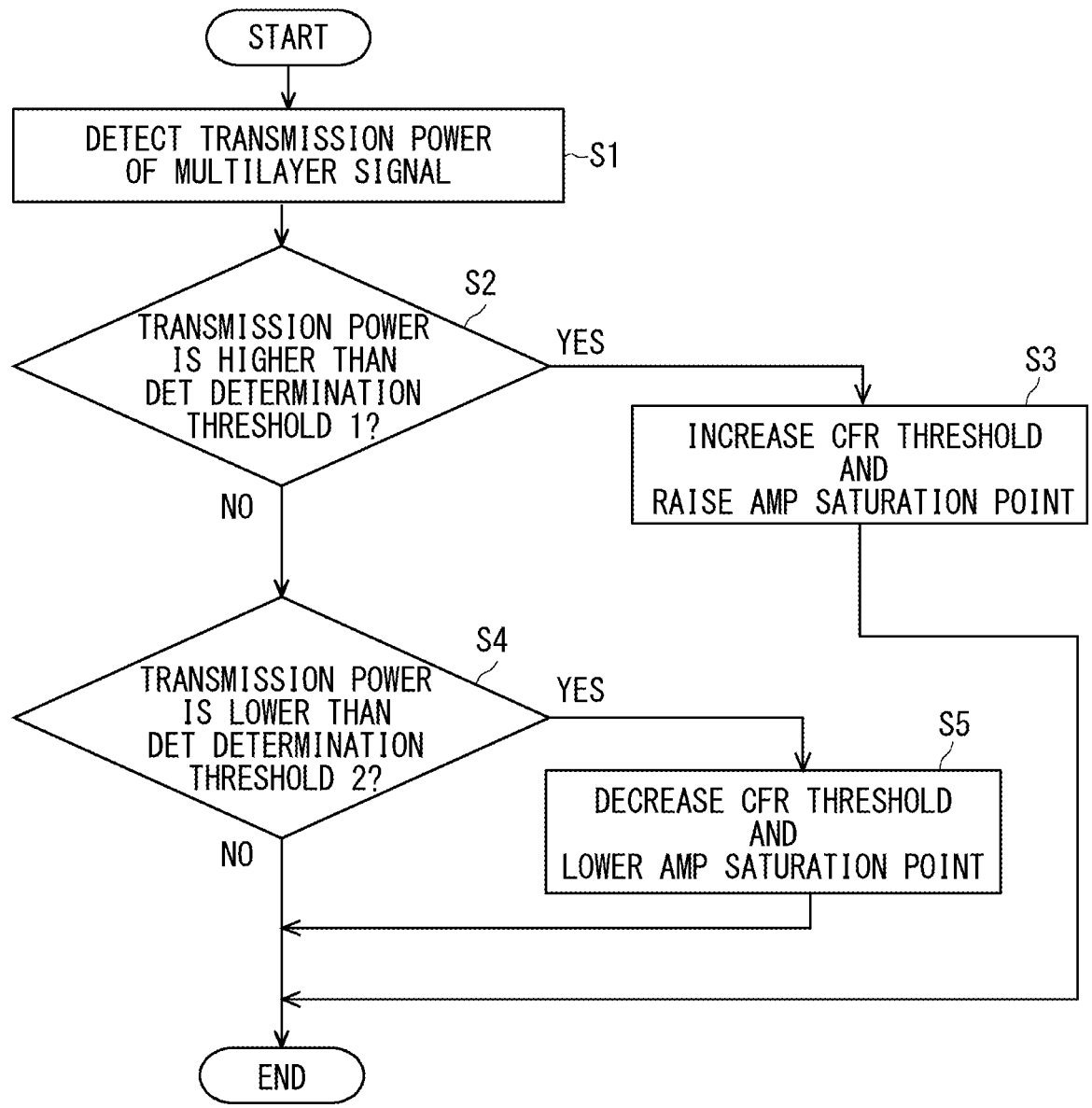
FIG. 7 is a view showing an operation example of the wireless communication apparatus according to the second example embodiment.

An operation example of the wireless communication apparatus 10 according to the second example embodiment is described hereinafter with reference to FIG. 7. FIG. 7 is a view illustrating an operation example of the wireless communication apparatus according to the second example embodiment. FIG. 7 shows the operation performed at every specified time in each of the detection circuits 321-1 to 321-N of the detection unit 32 and the control unit 31. The following description uses the detection circuit 321-1 in the detection unit 32 for the sake of convenience.

First, the detection circuit 321-1 in the detection unit 32 detects the transmission power of the input multilayer signal (Step S1). The detection circuit 321-1 in the detection unit 32 detects the average value of the transmission power of the multilayer signal at every specified time. The detection circuit 321-1 in the detection unit 32 transmits the detected transmission power information to the control unit 31.

Next, the control unit 31 determines whether the transmission power of the multilayer signal received from the detection unit 32 is higher than the DET determination threshold 1 or not (Step S2).

When the transmission power is higher than the DET determination threshold 1 (Yes in Step S2), the control unit 31 increases the CFR threshold of the CFR processing unit 33-1 to be higher than the current value and raises the saturation point of the AMP 24-1 (Step S3). To be specific, the control unit 31 increases the CFR threshold of the CFR processing unit 33-1 by the value of difference between the transmission power detected by the detection circuit 321-1 of the detection unit 32 and the reference level. Further, the control unit 31 requests the AMP power supply 27 to increase the voltage applied to the AMP 24-1 so as to raise the saturation point of the AMP 24-1 by the value of difference between the transmission power detected by the detection circuit 321-1 of the detection unit 32 and the reference level.

When, on the other hand, the transmission power is not higher than the DET determination threshold 1 (No in Step S2), the process proceeds to Step S4.

Then, the control unit 31 determines whether the transmission power of the multilayer signal received from the detection unit 32 is lower than the DET determination threshold 2 or not (Step S4).

When the transmission power is lower than the DET determination threshold 2 (Yes in Step S4), the control unit 31 decreases the CFR threshold of the CFR processing unit 33-1 corresponding to the detection circuit 321-1 of the detection unit 32 to be lower than the current value and also lowers the saturation point of the AMP 24-1 (Step S5). When the CFR threshold is higher than the initial value of the CFR threshold upon startup of the wireless communication apparatus 10, the control unit 31 may perform control to set the CFR threshold back to the initial value. When the saturation point of the AMP 24 is higher than the initial value of the saturation point of the AMP 24 upon startup of the wireless communication apparatus 10, the control unit 31 may perform control to set the saturation point of the AMP 24 back to the initial value.

As described above, the detection unit 32 detects the transmission power of the multilayer signal input to each CFR processing unit 33, and when the transmission power of the multilayer signal exceeds the DET determination threshold 1, the control unit 31 performs control to increase the CFR threshold and raise the saturation point of the AMP 24. The control unit 31 performs control to increase the CFR threshold by the value of difference between the transmission power of the multilayer signal and the reference level and raises the saturation point of the AMP 24 by the same value of difference. Specifically, the control unit 31 performs control to maintain the linearity of the multilayer signal passing through all transmission systems in the wireless communication apparatus 10. The wireless communication apparatus 10 can thereby reduce the occurrence of non-linear distortion in the multilayer signal, which is a composite signal in which transmission signals to be transmitted to a plurality of terminals are superimposed on each other. Thus, in-band EVM (DL SINR) degradation that occurs when non-linear distortion arises in the multilayer signal does not occur in the wireless communication apparatus 10, and it is thereby possible to prevent throughput degradation due to DL SINR degradation for each terminal.

Further, the wireless communication apparatus 10 according to this example embodiment prevents emission of the multilayer signal from the transmission system subjected to non-linear distortion, thereby avoiding degradation of a beam pattern to each terminal and degradation of Null formation toward another terminal. In other words, in the wireless communication apparatus 10 according to this example embodiment, there is no transmitter that emits the multilayer signal with unnecessary amplitude or phase variations, which avoids degradation of a beam pattern to each terminal and degradation of Null formation toward another terminal. This example embodiment thereby enables achievement of good MU-MIMO capability.

Further, even when the transmission power of the multilayer signal is not equal and varies among the transmitters, the wireless communication apparatus 10 according to the second example embodiment autonomously carries out optimal control for obtaining the linearity of the transmission system in the subsequent stage including the AMP 24 with high transmission power. Therefore, use of the wireless communication apparatus 10 allows maintaining good MU-MIMO capability and preventing breakdown and increase in power consumption of the AMP apparatus due to over input occurring, which is CFR effects. By use of the wireless communication apparatus 10, it is possible to prevent excessive spectrum spreading due to AMP hard clipping and full saturation upon use of DPD processing. Therefore, the wireless communication apparatus 10 according to the second example embodiment enables maintenance of DPD effects.

Modified Example

Although the detection unit 32 detects the average value at every specified time of the transmission power of the multilayer signal in the above-described second example embodiment, it may be modified as follows.

The detection unit 32 may detect the peak power of the transmission power of the multilayer signal input to each CFR processing unit 33. Alternatively, the detection unit 32 may detect both of the average value at every specified time of the transmission power of the multilayer signal input to each CFR processing unit 33 and the peak power of the transmission power of the multilayer signal input to each CFR processing unit 33.

In this case, the DET determination threshold 1 and the reference level to be used by the control unit 31 are set for each of the average value and the peak power described above. When the detection unit 32 detects the peak power of the transmission power of the multilayer signal input to each CFR processing unit 33, the control unit 31 determines whether the peak power is higher than the DET determination threshold 1 for peak power. When the multilayer signal where the peak power of the multilayer signal is higher than the DET determination threshold 1 for peak power exists, the control unit 31 changes the CFR threshold to which the multilayer signal is input and the saturation point of the AMP 24 corresponding to the CFR processing unit 33 to change the CFR threshold. The control unit 31 increases the CFR threshold and the saturation point of the AMP 24 by the value of difference between the peak power of the multilayer signal and the reference level for peak power.

When the detection unit 32 detects both of the average value at every specified time and the peak power of the transmission power of the multilayer signal input to each CFR processing unit 33, the control unit 31 determines whether each of the average value and the peak power is higher than the DET determination threshold 1 or not. To be specific, the control unit 31 determines whether the average value and the peak power are higher than the DET determination threshold 1 for average value and the DET determination threshold 1 for peak power, respectively.

When at least one of the multilayer signal exceeding the DET determination threshold 1 for average value and the multilayer signal exceeding the DET determination threshold 1 for peak power exists, the control unit 31 changes the CFR threshold to which the multilayer signal is input and the saturation point of the corresponding AMP 24. The control unit 31 calculates a difference between the average value of the multilayer signal input to the CFR processing unit 33 where the CFR threshold is to be changed and the reference level for average value, and a difference between the peak power and the reference level for peak power. The control unit 31 then increases the CFR threshold and the saturation point of the AMP 24 by the larger value of those calculated differences. Note that the control unit 31 may perform control to increase the CFR threshold and the saturation point of the AMP 24 by the average value of the calculated differences. Further, when the detection unit 32 detects the average value and the peak power, an operator or a maintenance person who manages the wireless communication apparatus 10 may determine whether the control unit 31 uses the average value, the peak power, or both of them.

Third Example Embodiment

A third example embodiment is described hereinafter. The third example embodiment is an example embodiment in which the first example embodiment is described in more detail. In the second example embodiment, the control unit of the wireless communication apparatus controls the CFR threshold and the saturation point of the amplifier (AMP) based on the transmission power of the multilayer signal. In the third example embodiment, the control unit of the wireless communication apparatus controls the transmission power of the multilayer signal based on the transmission power of the multilayer signal.

<Configuration Example of Wireless Communication Apparatus>

A configuration example of a wireless communication apparatus according to the third example embodiment is described hereinafter. The basic configuration of the wireless communication apparatus according to the third example embodiment is the same as that of the second example embodiment, and therefore it is described with reference to FIG. 4. Further, in the configuration example of the wireless communication apparatus according to the third example embodiment, the description of the same functional units as in the second example embodiment is omitted as appropriate. Note that the wireless communication apparatus 10 of the third example embodiment is different from that of the second example embodiment in the configuration of the control unit 31.

The control unit 31 is equivalent of the control unit 5 in the first example embodiment. The control unit 31 receives the transmission power information of the multilayer signal input to each CFR processing unit 33 from the detection unit 32. The control unit 31 controls the transmission power of the multilayer signal input to all the CFR processing units 33 (CFR processing units 33-1 to 33-N) in accordance with the transmission power detected by the detection unit 32.

To be specific, the control unit 31 determines whether the transmission power detected by the detection unit 32 is higher than the DET determination threshold 1 or not. When the multilayer signal where the transmission power detected by the detection unit 32 is higher than the DET determination threshold 1 exists, the control unit 31 performs control to decrease the transmission power of all the multilayer signals input to the CFR processing units 33-1 to 33-N.

The control unit 31 performs control to decrease the transmission power of all the multilayer signals input to the CFR processing units 33-1 to 33-N by the value corresponding to a difference between the transmission power exceeding the DET determination threshold 1 and the reference level. To be specific, the control unit 31 acquires the total transmission power (the total power of all transmitters) of the multilayer signal input to each transmitter, divides the acquired total transmission power by the number of transmitters, and thereby calculates the average power of the transmitters. The control unit 31 calculates a difference between the calculated average transmission power of the transmitters and the reference level. The control unit 31 performs control to decrease the transmission power of all the multilayer signals input to the CFR processing units 33-1 to 33-N by the value of difference between the calculated average transmission power and the reference level. Note that the reference level is the average value of the transmission power in each transmission system when the wireless communication apparatus 10 outputs the signal at maximum voltage rating.

When a value corresponding to a difference between the transmission power exceeding the DET determination threshold 1 and the reference level is an offset value, the control unit 31 offsets the transmission power of all the multilayer signals by using the offset value.

Note that, because the control unit 31 carries out control that decreases the transmission power of all the multilayer signals, the emission level of the multilayer signals emitted to each terminal upon spatial multiplexing decreases. In other words, the separation distance between the wireless communication apparatus 10 and each terminal is reduced. Therefore, the control unit 31 determines whether a throughput in a plurality of terminal decreases or not if the control unit 31 decreases the transmission power of all the multilayer signals based on a radio transmission channel with each terminal in accordance with UL (Uplink) channel estimation results. When the control unit 31 determines that a throughput in a plurality of terminal does not decrease, it controls the transmission power of all the multilayer signals.

The control unit 31 can grasp the status of radio transmission channels between each terminal and the ANTs 26-1 to 26-N by using the UL channel estimation results. Therefore, when the control unit 31 determines whether the throughput in a plurality of terminals decreases or not when it reduces the transmission power of all the multilayer signals based on the status of radio transmission channels with each terminal.

<Operation Example of Wireless Communication Apparatus>

Figure 8:
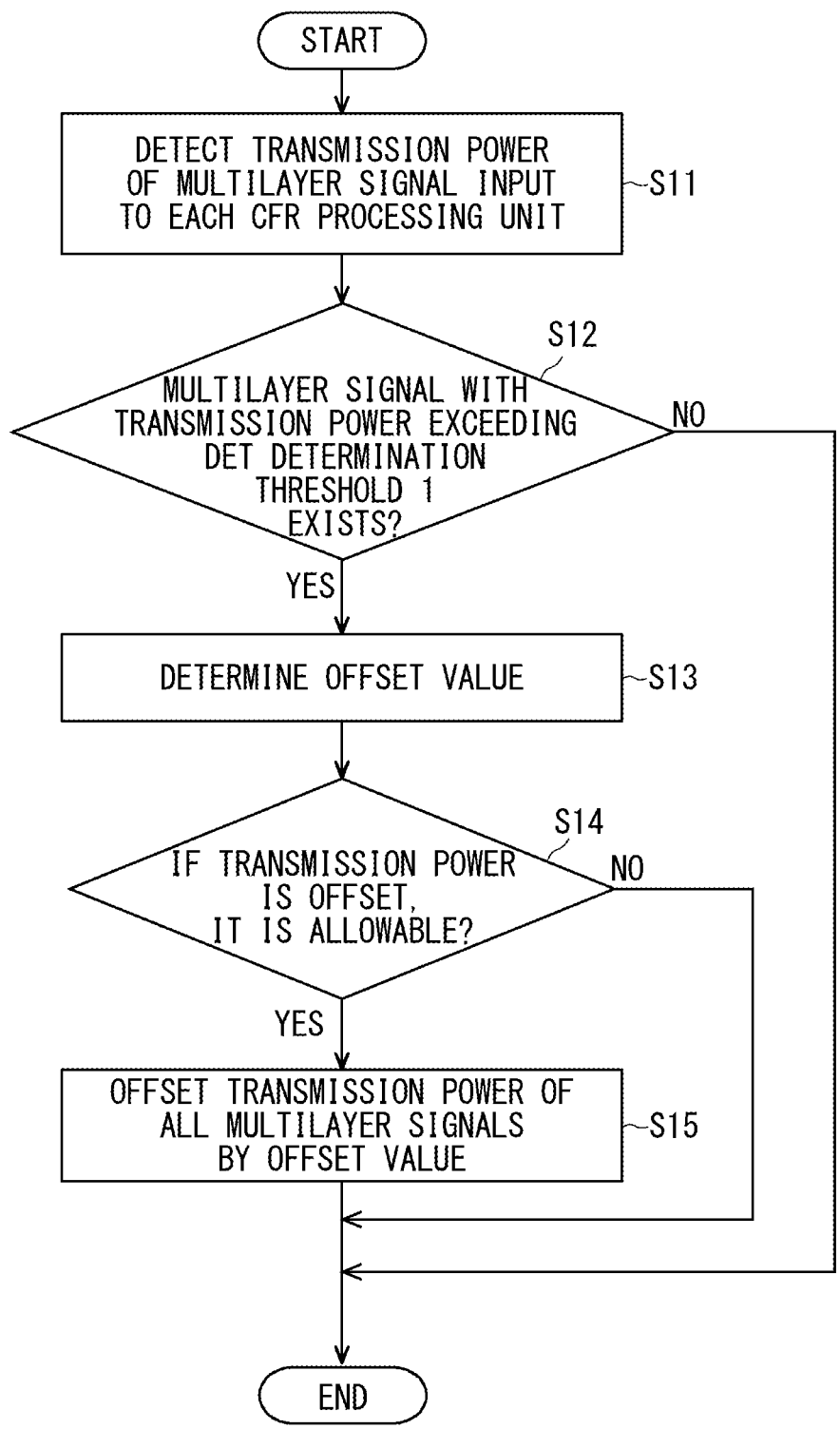
FIG. 8 is a view showing an operation example of a wireless communication apparatus according to a third example embodiment.

An operation example of the wireless communication apparatus according to the third example embodiment is described hereinafter with reference to FIG. 8. FIG. 8 is a view illustrating an operation example of the wireless communication apparatus according to the third example embodiment. FIG. 8 shows the operation performed at every specified time in the detection circuit 32 and the control unit 31.

First, the detection circuits 321-1 to 321-N in the detection unit 32 detects the transmission power of the multilayer signal input to the CFR processing unit 33-1 to 33-N(Step S11). The detection circuits 321-1 to 321-N in the detection unit 32 detect the average value at every specified time of the transmission power of the multilayer signal. The detection circuits 321-1 to 321-N in the detection unit 32 transmit the detected transmission power information to the control unit 31.

Next, the control unit 31 determines whether the multilayer signal with the transmission power exceeding the DET determination threshold 1 exists or not (Step S12).

When the multilayer signal with the transmission power exceeding the DET determination threshold 1 does not exist (No in Step S12), the process ends.

On the other hand, when the multilayer signal with the transmission power exceeding the DET determination threshold 1 exists (Yes in Step S12), the process proceeds to Step S13.

Then, the control unit 31 calculates the offset value (Step S13). The control unit 31 acquires the total transmission power (the total power of all transmitters) of the multilayer signal input to each transmitter, divides the acquired total transmission power by the number of transmitters, and thereby calculates the average transmission power of the transmitters. The control unit 31 calculates a difference between the calculated average transmission power of the transmitters and the reference level, and determines the calculated value as the offset value.

Then, the control unit 31 determines whether, if the transmission power is offset, it is allowable transmission power or not (Step S14) To be specific, the control unit 31 determines whether a throughput in a plurality of terminals decreases or not if it reduces the transmission power of all the multilayer signals based on UL channel estimation results from each terminal to the wireless communication apparatus 10.

When the control unit 31 determines that the offset transmission power is allowable transmission power (Yes in Step S14), the control unit 31 offsets the transmission power of all the multilayer signals by the offset value (Step S15). To be specific, when the control unit 31 determines that the throughput in a plurality of terminals does not decrease when it reduces the transmission power of all the multilayer signals based on UL channel estimation results, the control unit 31 offsets the transmission power of all the multilayer signals by using the offset value.

On the other hand, when the control unit 31 determines that the offset transmission power is not allowable transmission power (No in Step S14), the process ends. To be specific, when the control unit 31 determines that a throughput in a plurality of terminals decreases if it reduces the transmission power of all the multilayer signals based on UL channel estimation results, the control unit 31 does not offset the transmission power of all the multilayer signals by the offset value and ends the process.

As described above, when the transmission power of the multilayer signal input to each CFR processing unit 33 which is detected by the detection unit 32 exceeds the DET determination threshold 1, the control unit 31 performs control to decrease the transmission power of the multilayer signal input to each CFR processing unit 33. The control unit 31 reduces the transmission power of the multilayer signal input to each CFR processing unit 33 so that it does not exceed the reference level. Specifically, the control unit 31 performs control to maintain the linearity of the multilayer signals passing through all transmission systems in the wireless communication apparatus 10. The wireless communication apparatus 10 can thereby reduce the occurrence of non-linear distortion in the multilayer signal, which is a composite signal in which transmission signals to be transmitted to a plurality of terminals are superimposed on each other. Thus, in-band EVM (DL SINR) degradation that occurs when non-linear distortion arises in the multilayer signal does not occur in the wireless communication apparatus 10, and it is thereby possible to prevent throughput degradation due to DL SINR degradation for each terminal.

Further, the wireless communication apparatus 10 according to this example embodiment prevents emission of the multilayer signal from the transmission system subjected to non-linear distortion, thereby avoiding degradation of a beam pattern to each terminal and degradation of Null formation toward another terminal. In other words, in the wireless communication apparatus 10 according to this example embodiment, there is no transmitter that emits the multilayer signal with unnecessary amplitude or phase variations, which avoids degradation of a beam pattern to each terminal and degradation of Null formation toward another terminal. The wireless communication apparatus 10 according to this example embodiment thereby enables achievement of good MU-MIMO capability.

Further, in the third example embodiment, the CFR threshold and the AMP saturation point are not changed for the transmission power of the multilayer signal (composite signal) that passes through the transmission system exceeding the DET determination threshold 1. Therefore, in the third example embodiment, it is possible to ensure and maintain backoff between the AMP saturation output level and the CFR threshold in the transmission system exceeding the DET determination threshold 1. Use of the wireless communication apparatus 10 thereby allows maintaining good MU-MIMO capability and preventing breakdown and increase in power consumption of the AMP apparatus due to over input occurring, which is CFR effects. By use of the wireless communication apparatus 10, it is possible to prevent excessive spectrum spreading due to AMP hard clipping and full saturation upon use of DPD processing. Therefore, the wireless communication apparatus 10 according to the third example embodiment enables maintenance of DPD effects.

Modified Example

Although the TRX-baseband unit 22 includes the control unit 31 in the third example embodiment described above, the baseband unit 15 may include the control unit 31, or the baseband unit 15 may include another control unit. In the configuration where the baseband unit 15 includes the control unit 31, the control unit 31 receives the transmission power information from the detection circuits 321-1 to 321-N. The control unit 31 then controls the transmission power of the multilayer signal transmitted from the baseband unit 15 based on the received transmission power information. The same effects as in the above-described embodiment can be obtained in this manner.

Further, in the above-described third example embodiment also, the detection unit 32 detects the average value the transmission power of the multilayer signal at every specified time; however, the detection unit 32 may detect the peak power of the transmission power of the multilayer signal input to each CFR processing unit 33. Alternatively, the detection unit 32 may detect both of the average value at every specified time of the transmission power of the multilayer signal input to each CFR processing unit 33 and the peak power of the transmission power of the multilayer signal input to each CFR processing unit 33.

In this case, the DET determination threshold 1 and the reference level used by the control unit 31 are set for each of the average value and the peak power described above. When the detection unit 32 detects the peak power of the transmission power of the multilayer signal input to each CFR processing unit 33, the control unit 31 determines whether the peak power is higher than the DET determination threshold 1 for peak power. When the multilayer signal where the peak power of the multilayer signal is higher than the DET determination threshold 1 for peak power exists, the control unit 31 acquires the total transmission power of the multilayer signal input to each transmitter, divides the acquired total transmission power by the number of transmitters, and thereby calculates the average transmission power of the transmitters. The control unit 31 calculates a difference between the calculated average transmission power of the transmitters and the reference level, and determines the calculated value as the offset value.

When the detection unit 32 detects both of the average value at every specified time and the peak power of the transmission power of the multilayer signal input to each CFR processing unit 33, the control unit 31 determines whether each of the average value and the peak power is higher than the DET determination threshold 1 or not. To be specific, the control unit 31 determines whether the average value and the peak power are higher than the DET determination threshold 1 for average value and the DET determination threshold 1 for peak power, respectively.

When at least one of the multilayer signal exceeding the DET determination threshold 1 for average value and the multilayer signal exceeding the DET determination threshold 1 for peak power exists, the control unit 31 acquires the total transmission power of the multilayer signal input to each transmitter. The control unit 31 divides the acquired total transmission power by the number of transmitters and thereby calculates the average transmission power of the transmitters. The control unit 31 calculates a difference between the calculated average transmission power of the transmitters and the reference level, and determines the calculated value as the offset value. Note that when the detection unit 32 detects the average value and the peak power, an operator or a maintenance person who manages the wireless communication apparatus 10 may determine whether the control unit 31 uses the average value, the peak power, or both of them.

Other Embodiments

Figure 9:
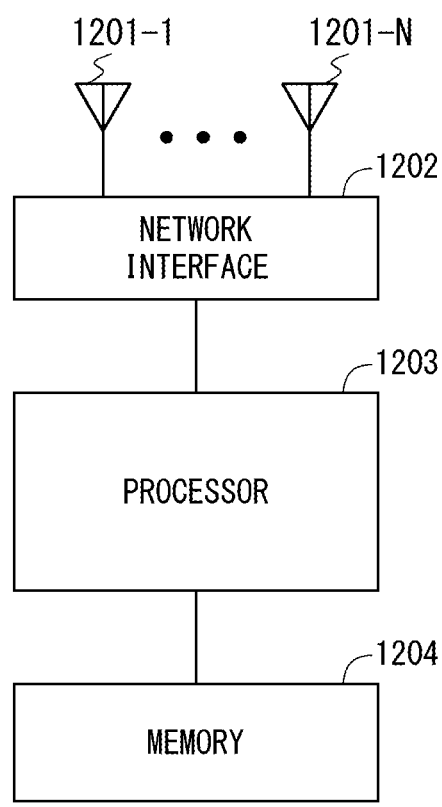
FIG. 9 is a block diagram showing an example of the hardware configuration of a computer (information processing apparatus) capable of implementing a wireless communication apparatus according to each embodiment.

The wireless communication apparatus 1 and the wireless communication apparatus 10 (which are referred to hereinafter as the wireless communication apparatus 1 and the like) according to the embodiments described above may have the following hardware configuration. FIG. 9 is a block diagram illustrating the hardware configuration of a computer (information processing apparatus) capable of implementing a wireless apparatus according to each embodiment.

Referring to FIG. 9, the wireless communication apparatus 1 and the like include a plurality of antennas 1201-1 to 1201-N, a network interface 1202, a processor 1203, and a memory 1204. The plurality of antennas 1201-1 to 1201-N and the network interface 1202 are used to communicate with another wireless communication apparatus including a plurality of terminals. The network interface 1202 may include a network interface card (NIC) conforming to IEEE 802.11 series, IEEE 802.3 series and the like, for example.

The processor 1203 reads and runs software (computer program) from the memory 1204 and thereby executes processing of the wireless communication apparatus 1 and the like that is described with reference to the flowcharts in the embodiments described above. The processor 1203 may be a microprocessor, an MPU (Micro Processing Unit) or a CPU (Central Processing Unit), for example. The processor 1203 may include a plurality of processors.

The memory 1204 is a combination of a volatile memory and a nonvolatile memory. The memory 1204 may include a storage that is provided apart from the processor 1203. In this case, the processor 1203 may access the memory 1204 through an I/O interface, which is not shown.

In the example of FIG. 9, the memory 1204 is used to store a group of software modules. The processor 1203 reads and runs the group of software modules from the memory 1204 and can thereby perform the processing of the wireless communication apparatus 1 and the like described in the above embodiments.

As described with reference to FIG. 9, each of processors included in the wireless communication apparatus 1 and the like runs one or a plurality of programs including a group of instructions for causing a computer to perform the algorithms described using the drawings.

According to the embodiments of the present disclosure described above, it is possible to provide a wireless communication apparatus, a wireless communication method, and a wireless communication program capable of achieving good MU-MIMO capability.

The programs can be stored and provided to a computer using any type of non-transitory computer readable media. Non-transitory computer readable media include any type of tangible storage media. Examples of non-transitory computer readable media include magnetic storage media (such as flexible disks, magnetic tapes, hard disk drives, etc.), optical magnetic storage media (e.g., magneto-optical disks), Compact Disc Read Only Memory (CD-ROM), CD-R, CD-R/W, and semiconductor memories (such as mask ROM, Programmable ROM (PROM), Erasable PROM (EPROM), flash ROM, Random Access Memory (RAM), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g., electric wires, and optical fibers) or a wireless communication line.

Note that the present disclosure is not limited to the above-described embodiments and can be modified as appropriate without departing from the spirit and scope of the present disclosure. Further, the present disclosure may be implemented by combining the above-described embodiments with one another.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

The whole or part of the exemplary embodiments disclosed above can be described as, but not limited to, the following supplementary notes.

(Supplementary Note 1)

A wireless communication apparatus comprising:

a plurality of amplifiers;

a plurality of peak component suppression units respectively corresponding to the amplifiers and configured to suppress, down to a first threshold, a peak level of a composite signal in which transmission signals to be transmitted to a plurality of terminals are superimposed;

a detection unit configured to detect transmission power of the composite signal input to each of the peak component suppression units; and a control unit configured to perform at least one of control of the first threshold of each peak component suppression unit and a saturation point of an amplifier corresponding to the peak component suppression unit and control of the transmission power of the composite signal in accordance with the transmission power detected by the detection unit.

(Supplementary Note 2)

The wireless communication apparatus according to Supplementary Note 1, wherein when a composite signal with the transmission power detected by the detection unit higher than a second threshold exists, the control unit increases the first threshold of a peak component suppression unit to which the composite signal is input and raises a saturation point of an amplifier corresponding to the peak component suppression unit.

(Supplementary Note 3)

The wireless communication apparatus according to Supplementary Note 2, wherein the control unit increases the first threshold of a peak component suppression unit to which the composite signal is input by a value of difference between the transmission power of the composite signal and a reference level, and raises a saturation point of an amplifier corresponding to the peak component suppression unit by the same value of difference.

(Supplementary Note 4)

The wireless communication apparatus according to any one of Supplementary Notes 1 to 3, wherein when a composite signal with the transmission power detected by the detection unit lower than a third threshold exists, the control unit decreases the first threshold of a peak component suppression unit to which the composite signal is input and lowers a saturation point of an amplifier corresponding to the peak component suppression unit.

(Supplementary Note 5)

The wireless communication apparatus according to claim 4, wherein when at least one of the first threshold of a peak component suppression unit to which the composite signal is input and the saturation point of an amplifier corresponding to the peak component suppression unit is higher than a respective one of the first threshold and the saturation point at the time of start-up of the apparatus, the control unit sets the first threshold of the peak component suppression unit and the saturation point of the amplifier back to the first threshold and the saturation point at the time of start-up of the apparatus.

(Supplementary Note 6)

The wireless communication apparatus according to any one of Supplementary Notes 1 to 5, wherein the control unit controls the saturation point by increasing and decreasing a voltage applied to the amplifier.

(Supplementary Note 7)

The wireless communication apparatus according to any one of Supplementary Notes 1 to 6, wherein when a composite signal with the transmission power detected by the detection unit higher than a second threshold exists, the control unit decreases transmission power of a composite signal input to the plurality of peak component suppression units.

(Supplementary Note 8)

The wireless communication apparatus according to Supplementary Note 7, wherein the control unit decreases transmission power of a composite signal input to the plurality of peak component suppression units by a value corresponding to a difference between transmission power exceeding the second threshold and a reference level.

(Supplementary Note 9)

The wireless communication apparatus according to Supplementary Note 8, wherein the control unit calculates average transmission power by dividing total transmission power of the composite signals input to a plurality of transmitters by the number of the plurality of transmitters, and decreases transmission power of a composite signal input to the plurality of peak component suppression units by a value of difference between the average transmission power and the reference level.

(Supplementary Note 10)

The wireless communication apparatus according to any one of Supplementary Notes 7 to 9, wherein the control unit determines whether a throughput of the plurality of terminals is degraded or not if transmission power of a composite signal input to the plurality of peak component suppression units is decreased based on UL (Uplink) channel estimation values related to channels between each terminal and a plurality of antennas, and when the control unit determines that a throughput of the plurality of terminals is not degraded, the control unit decreases transmission power of a composite signal input to the plurality of peak component suppression units.

(Supplementary Note 11)

The wireless communication apparatus according to any one of Supplementary Notes 1 to 10, wherein the transmission power detected by the detection unit includes at least one of an average value of transmission power of the composite signal at every specified time and peak power of transmission power of the composite signal, and when the transmission power detected by the detection unit is the average value and the peak power, a second threshold and a reference level are set for each of the average value and the peak power.

(Supplementary Note 12)

A wireless communication method comprising:

detecting transmission power of a composite signal input to each of a plurality of peak component suppression units, the composite signal containing transmission signals to be transmitted to a plurality of terminals superimposed on each other; and performing at least one of control of a first threshold for suppressing a peak level of the composite signal used in each peak component suppression unit and a saturation point of an amplifier corresponding to the peak component suppression unit and control of transmission power of the composite signal in accordance with the detected transmission power.

(Supplementary Note 13)

A wireless communication program causing a wireless communication apparatus to perform:

detecting transmission power of a composite signal input to each of a plurality of peak component suppression units, the composite signal containing transmission signals to be transmitted to a plurality of terminals superimposed on each other; and performing at least one of control of a first threshold for suppressing a peak level of the composite signal used in each peak component suppression unit and a saturation point of an amplifier corresponding to the peak component suppression unit and control of transmission power of the composite signal in accordance with the detected transmission power.

What is claimed is:

1. A wireless communication apparatus comprising:

a plurality of amplifiers;

a plurality of peak component suppression units respectively corresponding to the amplifiers and configured to suppress, down to a first threshold, a peak level of a composite signal in which transmission signals to be transmitted to a plurality of terminals are superimposed;

a detection unit configured to detect transmission power of the composite signal input to each of the peak component suppression units; and a control unit configured to perform at least one of control of the first threshold of each peak component suppression unit and a saturation point of an amplifier corresponding to the peak component suppression unit and control of the transmission power of the composite signal in accordance with the transmission power detected by the detection unit.

2. The wireless communication apparatus according to claim 1, wherein when a composite signal with the transmission power detected by the detection unit higher than a second threshold exists, the control unit increases the first threshold of a peak component suppression unit to which the composite signal is input and raises the saturation point of an amplifier corresponding to the peak component suppression unit.

3. The wireless communication apparatus according to claim 2, wherein the control unit increases the first threshold of a peak component suppression unit to which the composite signal is input by a value of difference between the transmission power of the composite signal and a reference level, and raises the saturation point of an amplifier corresponding to the peak component suppression unit by the same value of difference.

4. The wireless communication apparatus according to claim 1, wherein when a composite signal with the transmission power detected by the detection unit lower than a third threshold exists, the control unit decreases the first threshold of a peak component suppression unit to which the composite signal is input and lowers the saturation point of an amplifier corresponding to the peak component suppression unit.

5. The wireless communication apparatus according to claim 4, wherein when at least one of the first threshold of a peak component suppression unit to which the composite signal is input and the saturation point of an amplifier corresponding to the peak component suppression unit is higher than a respective one of the first threshold and the saturation point at the time of start-up of the apparatus, the control unit sets the first threshold of the peak component suppression unit and the saturation point of the amplifier back to the first threshold and the saturation point at the time of start-up of the apparatus.

6. The wireless communication apparatus according to claim 1, wherein the control unit controls the saturation point by increasing and decreasing a voltage applied to the amplifier.

7. The wireless communication apparatus according to claim 1, wherein when a composite signal with the transmission power detected by the detection unit higher than a second threshold exists, the control unit decreases transmission power of a composite signal input to the plurality of peak component suppression units.

8. The wireless communication apparatus according to claim 7, wherein the control unit decreases transmission power of a composite signal input to the plurality of peak component suppression units by a value corresponding to a difference between transmission power exceeding the second threshold and a reference level.

9. The wireless communication apparatus according to claim 8, wherein the control unit calculates average transmission power by dividing total transmission power of the composite signals input to a plurality of transmitters by the number of the plurality of transmitters, and decreases transmission power of a composite signal input to the plurality of peak component suppression units by a value of difference between the average transmission power and the reference level.

10. The wireless communication apparatus according to claim 7, wherein
the control unit determines whether a throughput of the plurality of terminals is degraded or not if transmission power of a composite signal input to the plurality of peak component suppression units is decreased based on UL (Uplink) channel estimation values related to channels between each terminal and a plurality of antennas, and
when the control unit determines that a throughput of the plurality of terminals is not degraded, the control unit decreases transmission power of a composite signal input to the plurality of peak component suppression units.

11. The wireless communication apparatus according to claim 1, wherein
the transmission power detected by the detection unit includes at least one of an average value of transmission power of the composite signal at every specified time and peak power of transmission power of the composite signal, and
when the transmission power detected by the detection unit is the average value and the peak power, a second threshold and a reference level are set for each of the average value and the peak power.

12. A wireless communication method comprising:
detecting transmission power of a composite signal input to each of a plurality of peak component suppression units, the composite signal containing transmission signals to be transmitted to a plurality of terminals superimposed on each other; and
performing at least one of control of a first threshold for suppressing a peak level of the composite signal used in each peak component suppression unit and a saturation point of an amplifier corresponding to the peak component suppression unit and control of transmission power of the composite signal in accordance with the detected transmission power.

13. A non-transitory computer readable medium storing a wireless communication program causing a wireless communication apparatus to perform:
detecting transmission power of a composite signal input to each of a plurality of peak component suppression units, the composite signal containing transmission signals to be transmitted to a plurality of terminals superimposed on each other; and
performing at least one of control of a first threshold for suppressing a peak level of the composite signal used in each peak component suppression unit and a saturation point of an amplifier corresponding to the peak component suppression unit and control of transmission power of the composite signal in accordance with the detected transmission power.

* * * * *

UNITED STATES PATENT AND TRADEMARK OFFICE
CERTIFICATE OF CORRECTION

PATENT NO. : 10,791,015 B2
APPLICATION NO. : 16/439842
DATED : September 29, 2020
INVENTOR(S) : Takuji Mochizuki It is certified that error appears in the above-identified patent and that said Letters Patent is hereby corrected as shown below:

In the Specification

Column 2, Background Art, Line 51; Delete "MU-MEMO" and insert --MU-MIMO-- therefor Column 6, Embodiments, Lines 45-46; Delete "($2\pi$/wavelength $\lambda$)d·sin $\theta$" and insert --($2\pi$/wavelength $\lambda$)d·sin$\theta$-- therefor Column 9, Embodiments, Line 10; Delete "AMPS" and insert --AMPs-- therefor Column 17, Embodiments, Line 26; After "(Step S14)", insert --.--

Signed and Sealed this
Twenty-second Day of December, 2020

Andrei Iancu
*Director of the United States Patent and Trademark Office*